United States Patent [19]

Komagata

[11] Patent Number: 5,142,154
[45] Date of Patent: Aug. 25, 1992

[54] CHARGED-PARTICLE BEAM LITHOGRAPHY AND CASSETTE FOR MATERIAL PATTERNED BY CHARGED-PARTICLE BEAM LITHOGRAPHIC APPARATUS

[75] Inventor: Tadashi Komagata, Tokyo, Japan

[73] Assignee: JEOL Ltd., Tokyo, Japan

[21] Appl. No.: 654,483

[22] Filed: Feb. 12, 1991

[30] Foreign Application Priority Data

Feb. 14, 1990 [JP] Japan ................................ 2-33154

[51] Int. Cl.⁵ .............................................. G21K 5/08
[52] U.S. Cl. ............................. 250/440.11; 250/492.2
[58] Field of Search ............... 250/440.1, 442.1, 441.1, 250/491.1, 492.2; 378/187

[56] References Cited

U.S. PATENT DOCUMENTS

| | | | |
|---|---|---|---|
| 4,159,799 | 7/1979 | Alles et al. | 235/486 |
| 4,280,054 | 7/1981 | Guarino | 250/440.1 |
| 4,412,133 | 10/1983 | Eckes et al. | 250/442.1 |
| 4,651,009 | 3/1987 | Totsuka | 250/442.1 |
| 4,711,438 | 12/1987 | Guarino | 269/152 |
| 4,851,692 | 7/1989 | Villano | 250/442.1 |

FOREIGN PATENT DOCUMENTS 60-5517 12/1985 Japan .

*Primary Examiner*—Bruce C. Anderson
*Attorney, Agent, or Firm*—Webb, Burden, Ziesenheim & Webb

[57] ABSTRACT

Method of writing a desired pattern onto a material with a focused charged-particle beam. The method is initiated by holding the material to be patterned on a cassette. The material is held on the cassette in such a way that the strains produced on the surface of the material are represented by substantially parallel straight contour lines. Under this condition, a desired pattern is written on the material while correcting beam shot position errors caused by the strains. Consequently, the errors regarding beam shot positions caused by the strains of the material are accurately corrected.

2 Claims, 4 Drawing Sheets

CHARGED-PARTICLE BEAM LITHOGRAPHY AND CASSETTE FOR MATERIAL PATTERNED BY CHARGED-PARTICLE BEAM LITHOGRAPHIC APPARATUS

FIELD OF THE INVENTION

The present invention relates to a method of writing each field of pattern onto a material with a charged-particle beam and also to a cassette for holding a material to be patterned by a charged-particle beam lithographic apparatus.

BACKGROUND OF THE INVENTION

In recent years, charged-particle beam lithographic apparatus have attracted attention as tools for manufacturing LSI devices and VLSI devices. FIG. 9 schematically shows the simplest electron beam lithographic apparatus that is one example of a charged-particle beam lithographic apparatus. In this figure, an electron gun 101 emits an electron beam, which is focused by an electron lens 102 onto a material 103 to be patterned. The position of the focused spot is controlled by the deflecting force produced by a deflector 104. A signal indicating the focused spot positions is sent to the deflector 104 from a controller 105 via an amplifier 106. As a result, a pattern is written at desired positions on the material. After one field of pattern is written with the electron beam, a stage drive mechanism 109 moves a stage under the control of the controller 105 in such a way that the center of the next field of pattern to be written arrives at the electron optical axis.

Normally, the material 103 to be patterned is held on a cassette 107 which is carried on the stage 108 capable of moving in two dimensions, or along the X and Y axes. FIG. 6 shows one example of the cassette 107 used in an electron beam lithographic apparatus or the like to hold the material to be patterned. In FIG. 6, the body of the cassette is indicated by numeral 1. Upper surface-limiting plates 3 are mounted at three locations on the body 1 of the cassette to limit the position of the upper surface of a mask substrate 2 that is a material to be patterned. FIG. 7 is a cross section taken through one of the upper surface-limiting plates 3. A spring 4 is mounted on the opposite side of the substrate 2 from each upper surface-limiting plate 3. The spring 4 has a protrusion T at its front end. A spring holder 5 is provided with a hole 6 in which the spring 4 is held. The substrate 2 is inserted between the set of limiting plates 3 and the set of springs 4. Therefore, the substrate 2 is pressed against the limiting plates 3 by the springs 4. As a result, the upper surface of the substrate 2 is accurately flush with the lower surface of each upper surface-limiting plate 3. The X and Y coordinates of the substrate are limited by means of pins 7.

In placing the mask substrate 2 in position on the cassette body 1, the substrate 2 is locked and supported by the limiting plates 3 and the springs 4 at three positions located around the substrate 2. At these three positions, the upper surface of the substrate is accurately maintained at a given height by the upper surface-limiting plates 3. However, the substrate 2 yields under the weight of its own. The flexure was calculated in three dimensions. FIG. 8 shows the flexure of the substrate thus calculated. In FIG. 6, the dot-and-dash lines show contours of amounts of strains. The numerals in the circles represent the amounts of strains in $\mu m$. The mask substrate 2 used for these calculations was a quartz glass plate 6 inch square and 0.09 inch thick. As can be seen from the contour map of FIG. 6, the strains produced on the mask substrate 2 do not have an orderly distribution because it is supported at three points.

Under this condition, if a pattern is written without correcting the beam shot positions, then the beam shot positions on the substrate differ from the desired ones. Consequently, the pattern is created with quite poor accuracy. Therefore, such errors between actual beam shot position and desired ones must be corrected. A countermeasure against this problem has been known, as disclosed in Japanese Patent Laid-Open No. 5517/1985. In particular, the amounts by which errors are corrected are measured at various locations on the material before a pattern is created on it. The measured amounts are stored in a memory. When a pattern is written at desired locations on the material in practice, appropriate amounts of correction are read from the memory. Then, the amount by which the electron beam is deflected or the amount of movement of the stage is adjusted according to the amounts of correction. Thus, the errors caused by the strains are corrected. Unfortunately, it is difficult to accurately forecast amounts of correction at locations other than the measured locations, because strains appear irregularly throughout the material to be patterned. For this reason, amounts of correction must be measured at numerous locations. Even if these numerous measurements are carried out in practice, it is impossible to correct the aforementioned errors accurately at other locations. Hence, the pattern is written with insufficient accuracy.

SUMMARY OF THE INVENTION

It is an object of the invention to provide a method of writing a pattern onto a material with a charged-particle beam in such a way that strains caused by the flexure produced in the material can be easily and accurately found by making the strains arising from the flexure of the material show an orderly distribution, whereby accurately correcting the errors regarding beam shot position.

It is another object of the invention to provide a cassette for holding the material in a charged-particle beam lithographic apparatus which carries out the method described in the preceding paragraph.

The first-mentioned object is achieved by a method comprising the steps of: holding a material to be patterned on a cassette in such a way that strains produced on the surface of the material are represented by substantially parallel straight contour lines; then writing a desired pattern at desired positions on the material; said step of writing the desired patterns being carried out while correcting beam shot position error caused by said strains.

DESCRIPTION OF THE PREFERRED EMBODIMENTS

Figure 1:
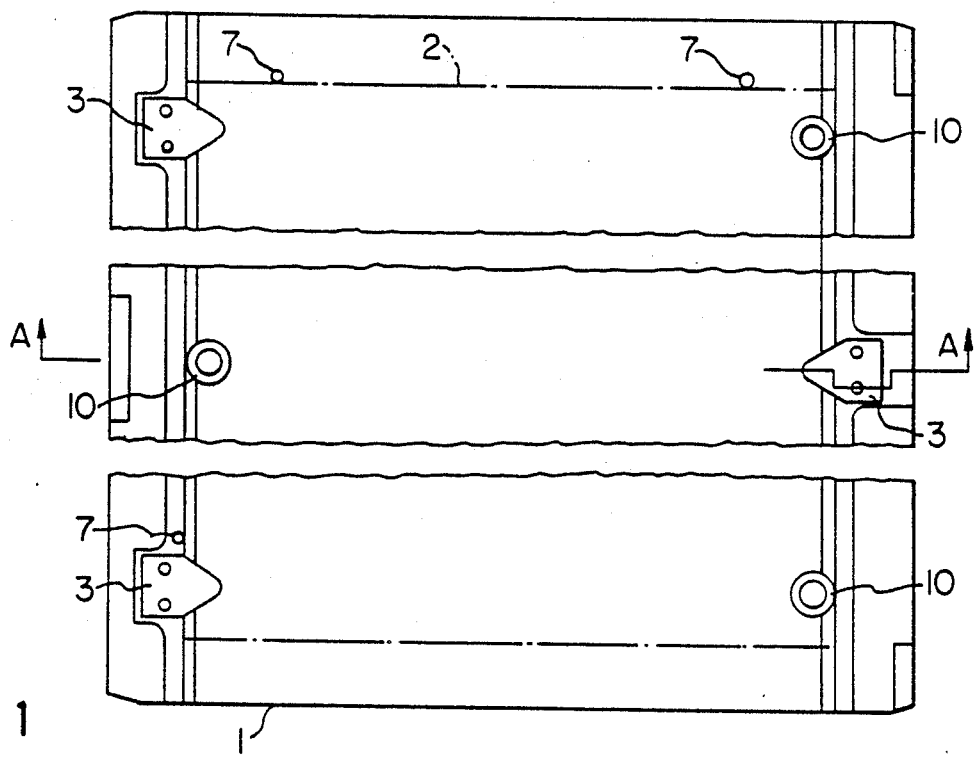
FIG. 1 is a plan view of a cassette holds a material used in charged-particle beam lithography according to the invention.
Figure 2:
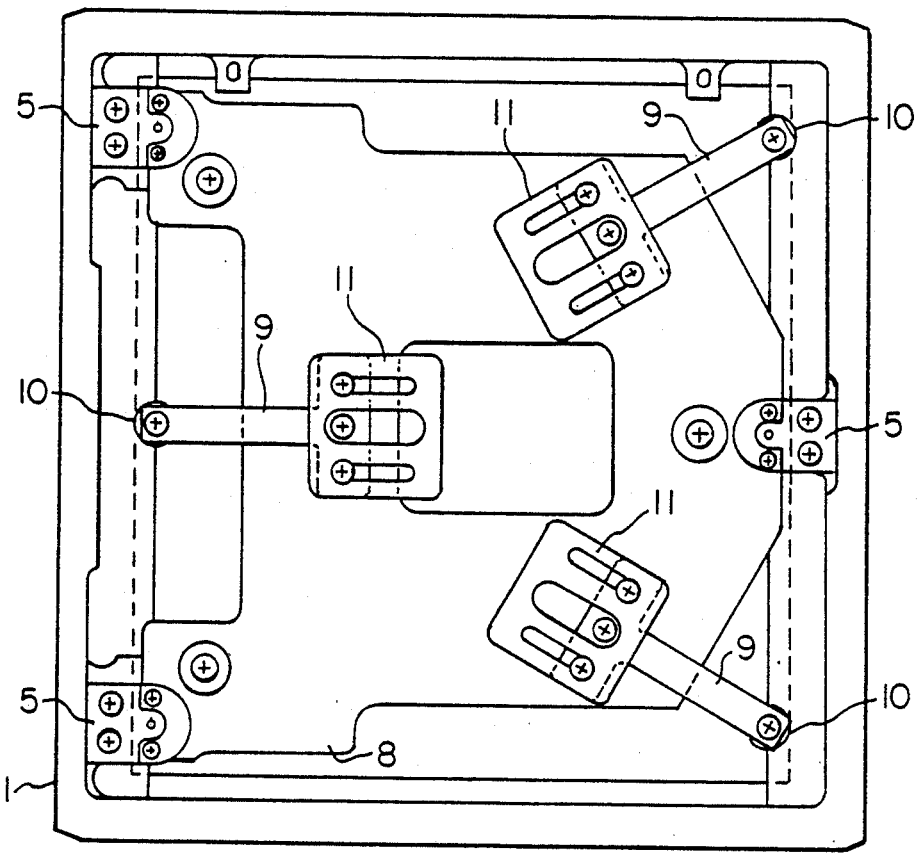
FIG. 2 is a rear elevation of the cassette shown in FIG. 1.
Figure 3:
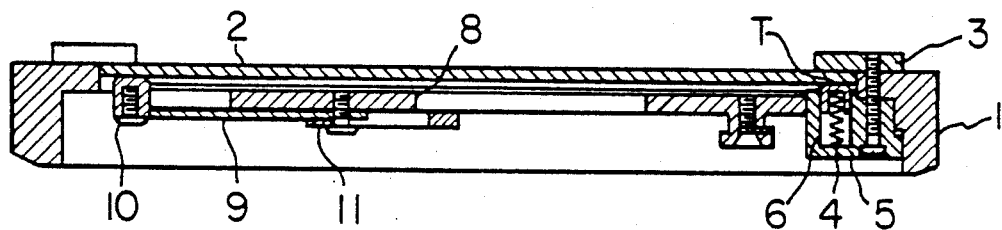
FIG. 3 is a cross-sectional view taken on line A—A of FIG. 1.
Figure 6:
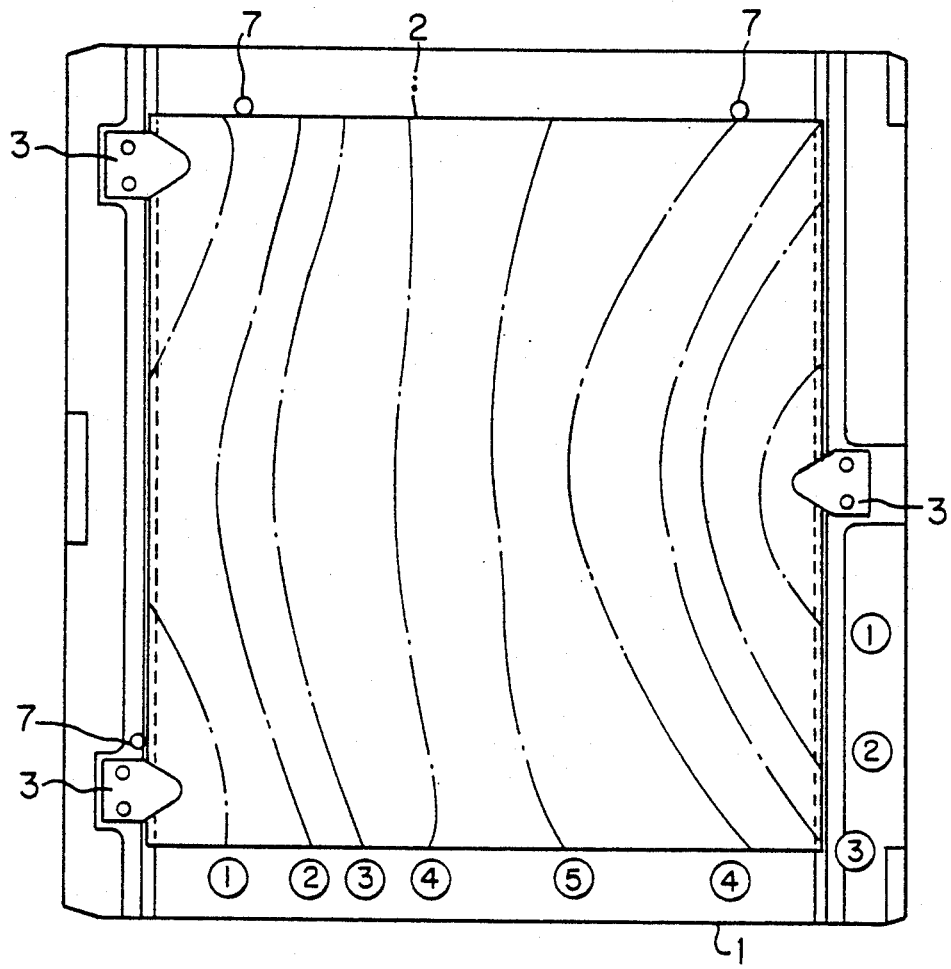
FIG. 6 is a plan view of a cassette for holding a material on the conventional charged-particle beam lithographic apparatus.

It is to be noted that like components are denoted by like reference numerals in various figures Referring to FIGS. 1, 2 and 3, there is shown a cassette built in accordance with the present invention. The cassette is used in charged-particle beam lithography. An elevating base 8 is detachably mounted to the body 1 of the cassette. Three spring holders 5 are mounted to the base 8 in such a manner that they are spaced apart from each other. Each spring holder 5 is provided with a hole 6 in which a spring 4 is mounted. Upper surface-limiting plates 3 are mounted to the body 1 in the same way as in the case of the cassette described already in connection with FIG. 6.

Pins 7 are mounted around the body 1 of the cassette to adjust the position of a mask substrate 2 along the X and Y axes. Three elevating bosses 10 which are urged upward by their respective elevating springs 9 are mounted to the body 1. The bosses 10 are so located that they are substantially diametrically opposite to the springs 4, respectively, with respect to the center of the substrate 2. Each elevating spring 9 is a leaf spring that is screwed to a spring holder 11. The urging force of each spring 9 can be adjusted by adjusting the position at which each spring 9 is screwed.

The mask substrate 2 is attached to the body 1 of this cassette from below and placed in position. Then, the elevating base 8 is mounted to the body 1 of the cassette from below the substrate 2. Under this condition, the substrate 2 is pressed against the upper surface-limiting plates 3 by the force of the springs 4. Therefore, the position of the upper surface of the substrate 2 is maintained at a given height. The elevating bosses 10 are upwardly urged against the substrate 2 by the springs 9 at locations which are diametrically opposite to the locations where the substrate 2 is urged against the upper surface-limiting surfaces 3 by the springs 4. Thus, the mask substrate 2 is urged upward at the six surrounding locations.

Figure 4:
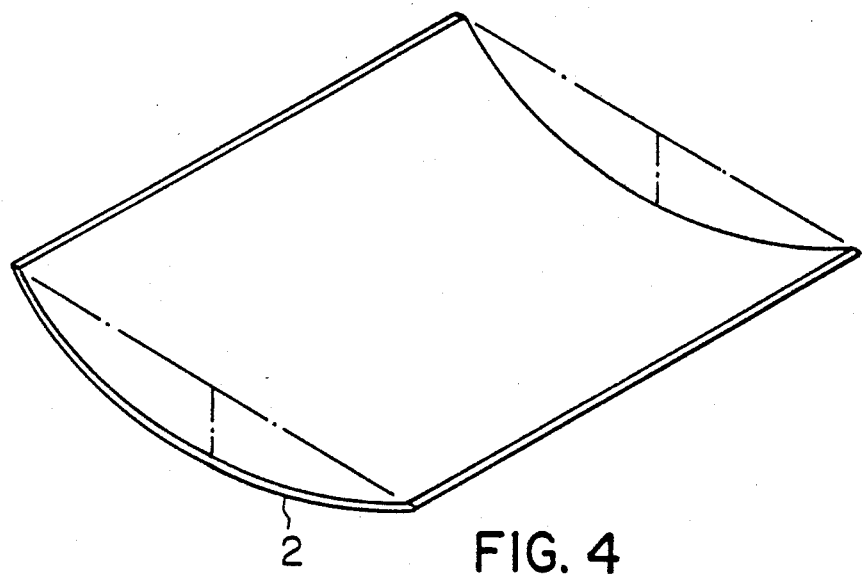
FIG. 4 is a three-dimensional representation of the flexure of a mask substrate caused by the weight of its own, the substrate being supported in accordance with the invention.
Figure 8:
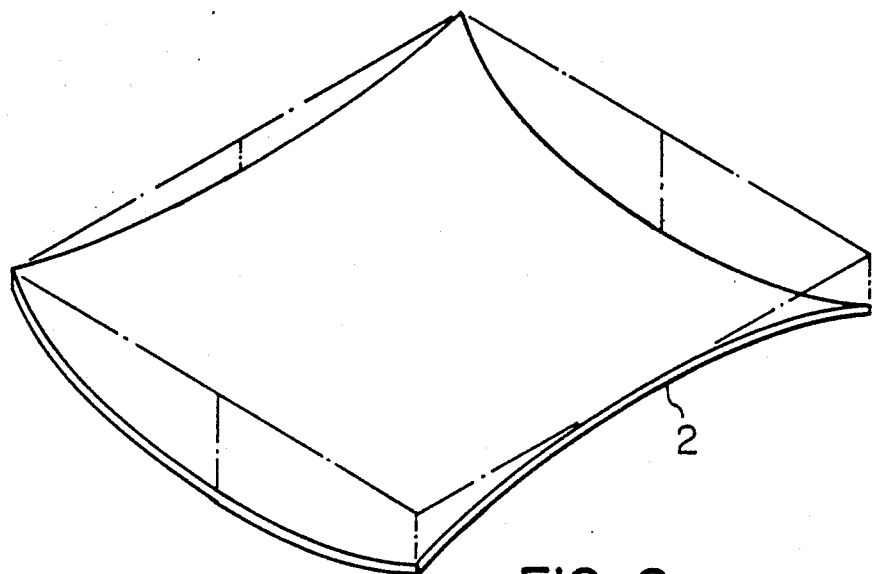
FIG. 8 is a three-dimensional representation of the distribution of strains produced on the mask substrate shown in FIG. 6.
Figure 5:
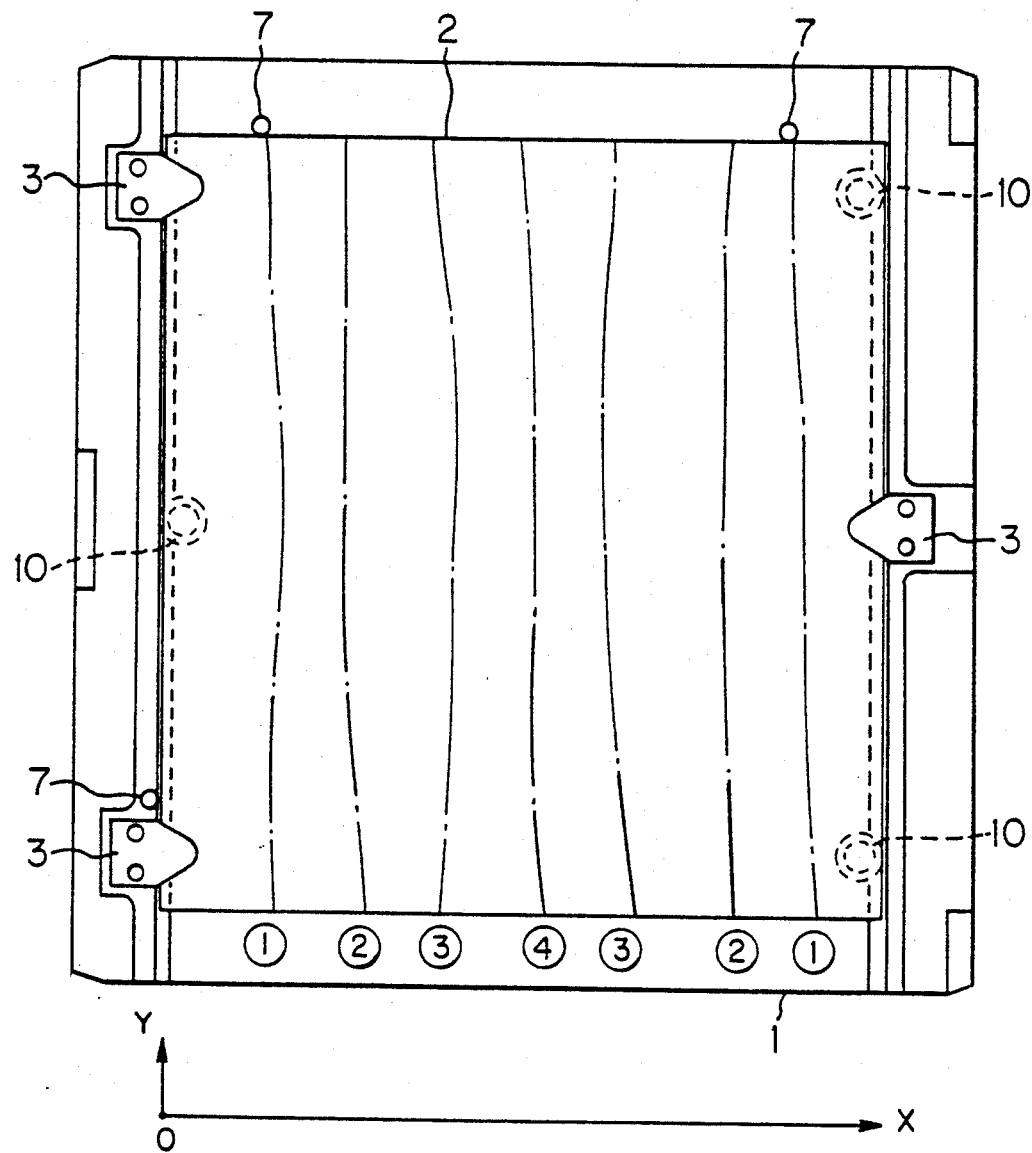
FIG. 5 is a plan view similar to FIG. 1, but in which contour lines representing amounts of strains in various locations on the mask substrate are also plotted, the contour lines being found by calculations.
Figure 7:
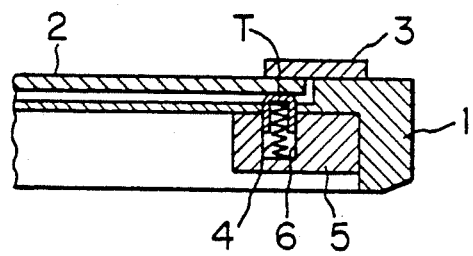
FIG. 7 is a fragmentary cross section of the cassette shown in FIG. 6.

We have calculated the distribution of strains produced on the mask substrate 2 by the weight of its own. FIG. 4 is a three-dimensional representation of this distribution. In FIG. 5, equal amounts of strain are indicated by contour lines which are given by the dot-and-dash lines. The numerals in the circles give amounts of strain in $\mu$m. The mask 2 is a quartz glass plates that is 6 inches square and 0.09 inch thick. As can be seen from FIG. 5, all the contour lines are substantially parallel straight lines. Consequently, the amount of strain produced on the mask substrate 2 changes linearly in an orderly manner across the substrate.

Figure 9:
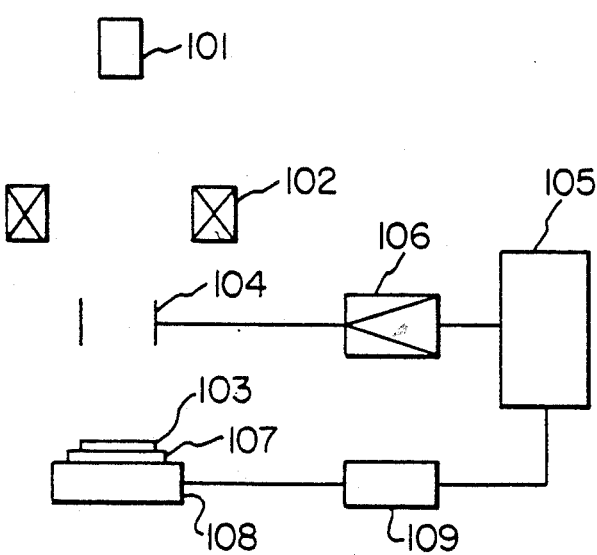
FIG. 9 is a schematic diagram of the simplest electron beam lithographic apparatus that is one example of a charged-particle beam lithographic apparatus.

The cassette built as described above is set on the stage of an electron beam lithographic apparatus as shown in FIG. 9. Before a pattern is written, the amounts by which beam shot position errors caused by the strains are corrected are measured at various locations, e.g., in every field, on the mask substrate. The measured amounts are stored in a memory. Since the strain changes linearly in an orderly manner across the substrate, it is only necessary to measure the amounts of correction vertically to the contour lines. When an electron beam is irradiated in practice and a pattern is written for every field on the mask substrate, the amounts of correction made for the fields to be written are read from the memory. The amount by which the beam is deflected or the amount of movement of the stage is adjusted according to the amounts of correction. If we suppose an X, Y coordinate shown in FIG. 5, the amount of correction, relating only to the errors, is function of X alone and has no Y component. Hence, the correction can be easily made by compensating the deflection of the beam or the amount of movement of the stage. As a result, the pattern can be written with improved accuracy.

In the above example, the leaf springs are used to push up the mask substrate. Other means may be employed for the same purpose.

As described thus far, the material to be patterned is held on a cassette in such a manner that the strains produced on the surface of the material are given by substantially parallel straight contour lines. Then, the pattern is written. Therefore, the errors regarding beam shot positions caused by the flexure of the material can be accurately and easily corrected. Hence, the pattern can be written with improved accuracy.

Having thus described my invention with the detail and particularity required by the Patent Laws, what is claimed to be protected by Letters Patent is set forth in the following claims.

I claim:

1. A method of writing a pattern onto a material with a focused charged-particle beam, comprising the steps of:

holding the material to be patterned on a cassette in such a way that strains produced on the surface of the material are represented by substantially parallel straight contour lines;

then writing a desired pattern at desired positions on the material while correcting beam shot position errors caused by said strains;

said step of holding the material to be patterned on the cassette being carried out by locking the material to a cassette body at three locations on the body and pushing up the material at positions which are located substantially diametrically opposite to the locking positions respectively.

2. A cassette for holding a material in a charged-particle beam lithographic apparatus, said cassette comprising:

a cassette body on which the material to be patterned is held;

means for locking the material to the cassette body at three locations on the body; and means which push up the material and are located substantially diametrically opposite to the locking means, respectively.

* * * * *

UNITED STATES PATENT AND TRADEMARK OFFICE
CERTIFICATE OF CORRECTION

PATENT NO. : 5,142,154
DATED : August 25, 1992
INVENTOR(S) : Tadashi Komagata It is certified that error appears in the above-identified patent and that said Letters Patent is hereby corrected as shown below:

Column 2 Line 58 after "cassette" insert --which--.

Column 3 Line 20 after "figures" insert --.--.

Signed and Sealed this

Fourteenth Day of September, 1993

Attest:

BRUCE LEHMAN

*Attesting Officer*    *Commissioner of Patents and Trademarks*